United States Patent

Costa et al.

[11] Patent Number: 5,960,865
[45] Date of Patent: Oct. 5, 1999

[54] MOUNTING BRACKET WITH INTEGRAL HEAT SINK CAPABILITIES

[75] Inventors: Richard Sander Costa, Bedminster, N.J.; Hung D. Mach, Flushing, N.Y.; Richard Alan Warncke, Freehold, N.J.

[73] Assignee: Lucent Technologies Inc., Murray Hill, N.J.

[21] Appl. No.: 09/118,239

[22] Filed: Jul. 17, 1998

[51] Int. Cl.⁶ .................................................. F28D 11/00
[52] U.S. Cl. ........................ 165/86; 165/80.3; 165/185; 361/697; 361/704; 174/16.3; 248/229.14; 248/278.1; 248/289.11; 248/291.11; 257/719
[58] Field of Search ........................ 165/86, 185, 80.3, 165/80.2; 361/704, 697; 257/718, 719; 174/16.3; 248/229.14, 278.1, 289.11, 291.11

[56] References Cited

U.S. PATENT DOCUMENTS

| | | | |
|---|---|---|---|
| 3,143,592 | 8/1964 | August | 174/16.3 |
| 3,312,277 | 4/1967 | Chitouras | 165/185 |
| 3,709,141 | 1/1973 | Schwartzstein | 165/185 |
| 3,820,592 | 6/1974 | Lander | 165/47 |
| 3,828,845 | 8/1974 | Waters | 165/45 |
| 4,369,838 | 1/1983 | Asanuma et al. | 165/185 |
| 4,982,783 | 1/1991 | Fickett et al. | 165/80.3 |
| 5,272,599 | 12/1993 | Koenen | 174/16.3 |
| 5,309,980 | 5/1994 | Mendeleev | 165/185 |
| 5,661,639 | 8/1997 | Furuno et al. | 361/704 |
| 5,775,418 | 7/1998 | Lonergan et al. | 165/80.2 |

*Primary Examiner*—Ira S. Lazarus
*Assistant Examiner*—Terrell McKinnon

[57] ABSTRACT

A bracket for mounting an antenna along with a transmitter or receiver on a pole or wall. The bracket is able to pivot in two perpendicular planes, and can be quickly and precisely aimed in a given direction, and clamped. The bracket comprises an intermediate member pivotally mounted to a base member and a support member. The bracket includes a plurality of fins forming a heat sink unitary with the bracket to dissipate heat generated by the electronics.

9 Claims, 2 Drawing Sheets

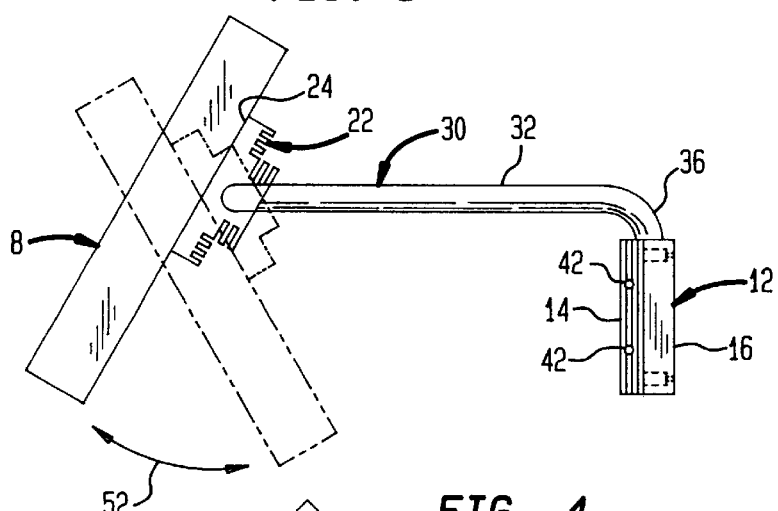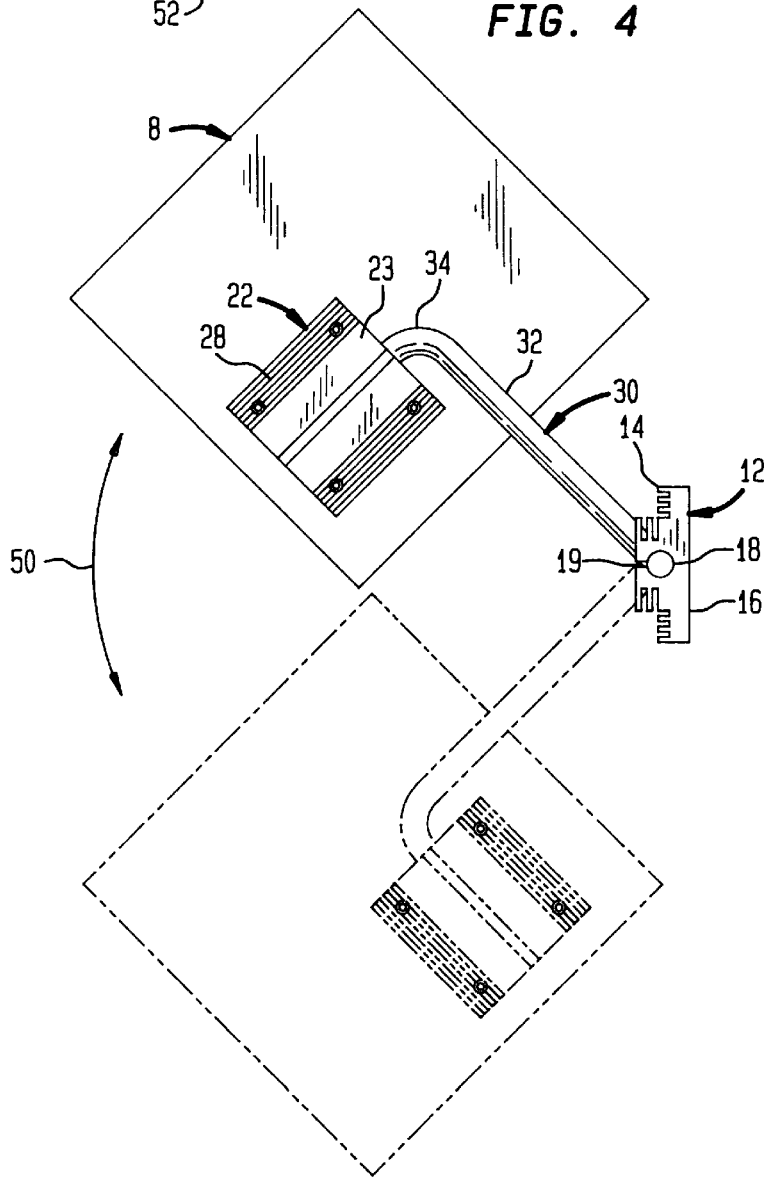

5,960,865

MOUNTING BRACKET WITH INTEGRAL HEAT SINK CAPABILITIES

FIELD OF THE INVENTION

This invention relates to the field of brackets, and more particularly to a mounting bracket for electronic instruments, the bracket being able to pivot in two perpendicular planes, and having a unitary heat sink.

BACKGROUND OF THE INVENTION

Certain types of electronic instruments are typically mounted on a building or pole or wall, and must be pointed in a given direction to function. With PCS and other wireless communication systems, antennas are aligned to provide coverage in predetermined sectors. In many cases, a transmitter, receiver, or amplifier is mounted along with the antenna. This equipment generates heat, and requires the use of heat sinks to prevent damage to the instrument. Brackets currently in use offer no such heat dissipating capability, so an additional heat sink must be installed. Active heat dissipating devices such as fans are prone to failure and require periodic maintenance.

Accordingly, there is a need to provide a mounting bracket having a heat sink unitary with the bracket. A bracket that can be quickly and precisely aimed in the given direction, and clamped. A bracket that is sturdy and vibration-free, yet cost-effective to manufacture.

SUMMARY OF THE INVENTION

In accordance with the present invention, there is provided a bracket for mounting an electronic instrument upon a foundation. The bracket comprises a base member having an outer surface and an opposite mounting surface for mounting the base member on the foundation. The bracket also comprises a support member having an outer surface and an opposite mounting surface for mounting the support member on the electronic instrument, the support member having a unitary heat sink for dissipating heat from the electronic instrument. The bracket further comprises an intermediate member extending between the base member and the support member. The intermediate member is pivotally attached to the base member. The intermediate member is pivotally attached to the support member.

BRIEF DESCRIPTION OF THE DRAWING

A more complete understanding of the present invention may be obtained from consideration of the following description in conjunction with the drawings, in which:

FIG. 3 is a side elevational view of the mounting bracket of FIG. 1;

FIG. 4 is a bottom plan view of the mounting bracket of FIG. 3;

DESCRIPTION OF THE PREFERRED EMBODIMENTS

Figure 1:
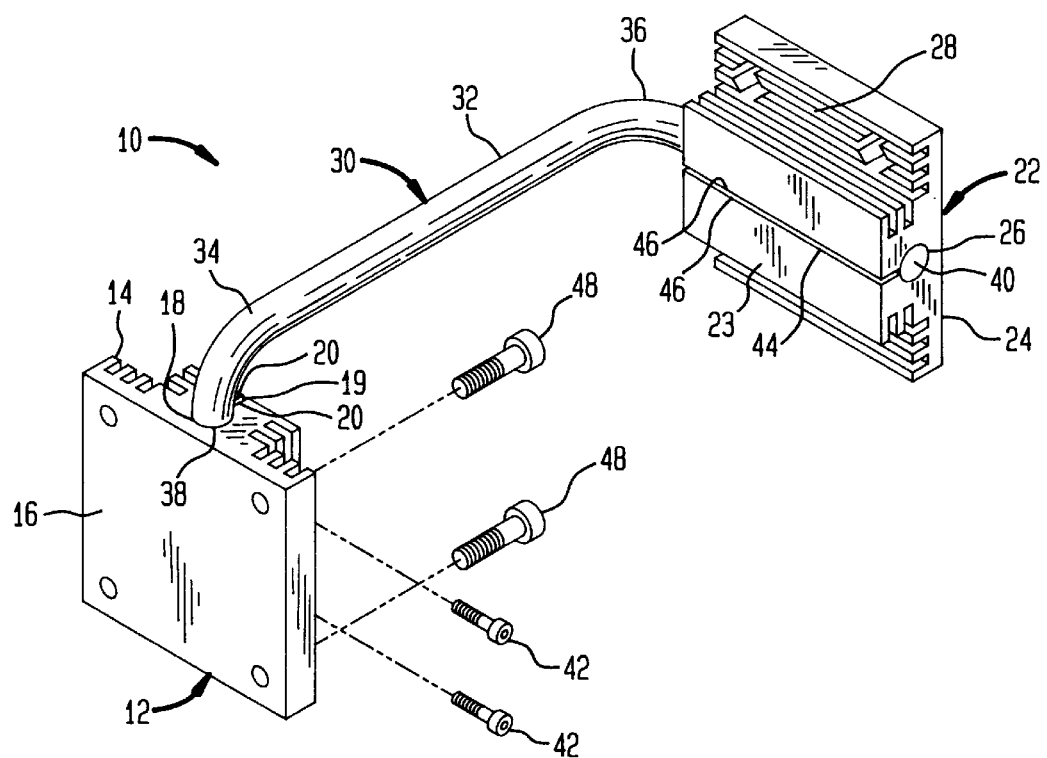
FIG. 1 is a perspective view of a mounting bracket constructed in accordance with the invention.

Referring now to the drawings, and especially to FIG. 1, a bracket is shown at 10 for mounting an electronic instrument 8, such as an antenna and additional circuitry, upon a foundation (not shown), such as a building, poll or wall. The bracket 10 comprises a base member 12 having an outer surface 14 and an opposite mounting surface 16 for mounting the base member 12 on the foundation. The base member 12 includes a base pivot hole 18, and a base slot 19 generally parallel to the base pivot hole 18. The base slot 19 communicates with the base pivot hole 18 and extends to the base member outer surface 14. The base slot 19 has opposite sides 20. Base mounting screws 48 fasten the base member to the foundation.

The bracket 10 also comprises a support member 23 having an outer surface 23 and an opposite mounting surface 24 for mounting the support member 23 on the instrument 8. The support member 23 is attached to the instrument 8 proximal to the heat producing source in order to optimize thermal transfer from the heat producing source through the instrument 8 to the bracket 10. The support member 23 includes a support pivot hole 26, and a support slot 44, generally parallel to the support pivot hole 26. The support slot 44 communicates with the support pivot hole 26 and extends to the support member outer surface 23. The support slot 44 has opposite sides 46. The support member 23 further includes a plurality of fins 28 arrayed on the outer surface 23, forming a heat sink unitary with the support member 23 for dissipating heat from the instrument 8. The base member 12, as an option, could be made with identical fins and dimensions, to simplify production, warehousing, and shipping.

The bracket 10 further comprises an intermediate member 30 extending between the base member 12 and the support member 23. The intermediate member 30 is thermally connected to the support member 23 providing an additional element for dissipating heat into the environment as well as to base member 12. The intermediate member 30 includes an elongated element 32 extending between opposite first 34 and second 36 ends. The intermediate member 30 has a first arm 38 extending generally perpendicularly from the elongated element first end 34. The first arm 38 and the elongated element 32 lie within a first plane. The first arm 38 pivotally engages the base pivot hole 18. The intermediate member 30 has a second arm 40 extending generally perpendicularly from the elongated element second end 36. The second arm 40 and the elongated element 32 lie within a second plane generally perpendicular to the first plane. The second arm 40 pivotally engages the support pivot hole 26.

A first clamping means is provided for releasably clamping the first arm 38 in the base pivot hole 18. This allows adjustment of a base angle of the elongated element 32 with respect to the base member 12 and selective locking of the base angle, shown by arrow 50 in FIG. 4. The first clamping means includes at least one clamping screw 42 disposed transversely to the base slot 19 and threadingly engaging the base member 12. Thus, as the clamping screw 42 is advanced, the opposite sides 20 of the base slot 19 will be drawn together, thereby clamping the first arm 38 in the base pivot hole 18.

A second clamping means is provided for releasably clamping the second arm 40 in the support pivot hole 26. This allows adjustment of a support angle of the support member 22 with respect to the elongated element 30 and selective locking of the support angle, shown by arrow 52 in FIG. 3. The second clamping means includes at least one clamping screw 42 disposed transversely to the support slot 44 and threadingly engaging the support member 22, so that as the clamping screw 42 is advanced, opposite sides 46 of the support slot 44 will be drawn together, thereby clamping the second arm 40 in the support pivot hole 26.

Figure 2:
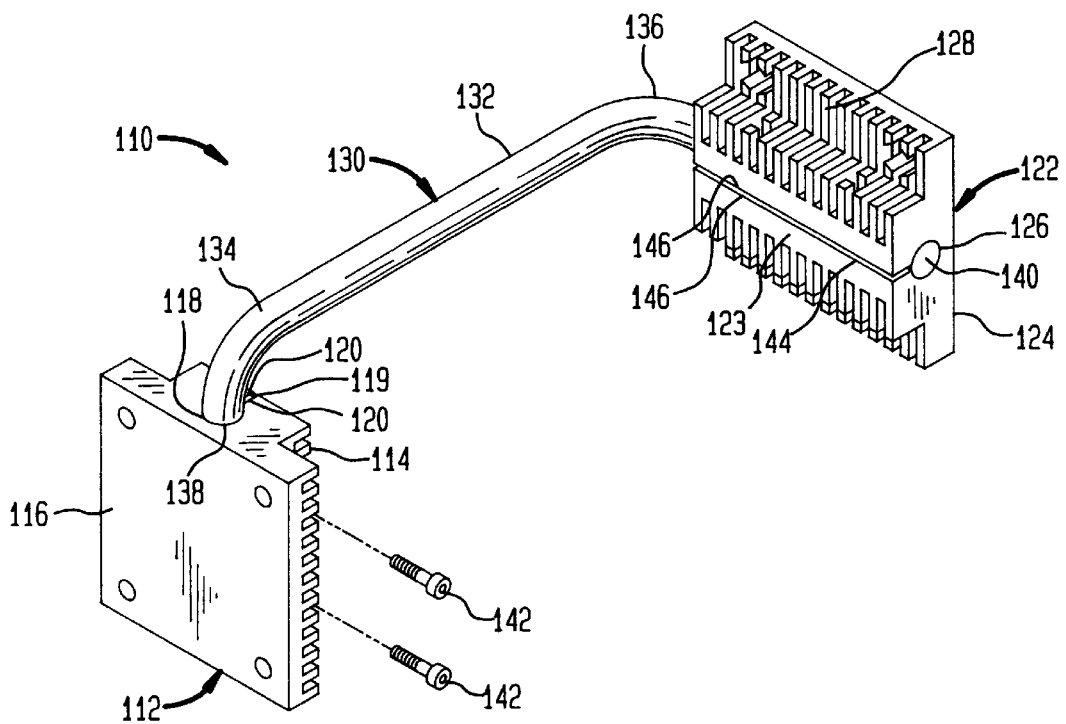
FIG. 2 is a perspective view of another mounting bracket constructed in accordance with the invention.

Turning now to FIG. 2, another embodiment of the bracket is shown at 110. The bracket 110 comprises a base member 112 having an outer surface 114 and an opposite mounting surface 116 for mounting the base member 112 on the foundation. The base member 112 includes a base pivot hole 118, and a base slot 119 generally parallel to the base pivot hole 118. The base slot 119 communicates with the base pivot hole 118 and extends to the base member outer surface 114. The base slot 119 has opposite sides 120.

The bracket 110 also comprises a support member 123 having an outer surface 123 and an opposite mounting surface 124 for mounting the support member 123 on the instrument. The support member 123 includes a support pivot hole 126, and a support slot 144, generally parallel to the support pivot hole 126. The support slot 144 communicates with the support pivot hole 126 and extends to the support member outer surface 123. The support slot 144 has opposite sides 146. The support member 123 further includes a plurality of fins 128 arrayed on the outer surface 123, forming a heat sink unitary with the support member 123 for dissipating heat from the instrument. The base member 112, as an option, could be made with identical fins and dimensions, to simplify production, warehousing, and shipping.

The bracket 110 further comprises an intermediate member 130 extending between the base member 112 and the support member 123. The intermediate member 130 includes an elongated element 132 extending between opposite first 134 and second 136 ends. The intermediate member 130 has a first arm 138 extending generally perpendicularly from the elongated element first end 134.

The first arm 138 and the elongated element 132 lie within a first plane. The first arm 138 pivotally engages the base pivot hole 118. The intermediate member 130 has a second arm 140 extending generally perpendicularly from the elongated element second end 136. The second arm 140 and the elongated element 132 lie within a second plane generally perpendicular to the first plane. The second arm 140 pivotally engages the support pivot hole 126.

A first clamping means is provided for releasably clamping the first arm 138 in the base pivot hole 118. This allows adjustment of a base angle of the elongated element 132 with respect to the base member 112 and selective locking of the base angle. The first clamping means includes at least one clamping screw 142 disposed transversely to the base slot 119 and threadingly engaging the base member 112. Thus, as the clamping screw 142 is advanced, the opposite sides 120 of the base slot 119 will be drawn together, thereby clamping the first arm 138 in the base pivot hole 118.

A second clamping means is provided for releasably clamping the second arm 140 in the support pivot hole 126. This allows adjustment of a support angle of the support member 122 with respect to the elongated element 130 and selective locking of the support angle. The second clamping means includes at least one clamping screw 142 disposed transversely to the support slot 144 and threadingly engaging the support member 122, so that as the clamping screw 142 is advanced, opposite sides 146 of the support slot 144 will be drawn together, thereby clamping the second arm 140 in the support pivot hole 126.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which will come within the scope of the appended claims is reserved.

What is claimed:

1. A bracket for mounting an instrument upon a foundation, the bracket comprising:

a base member having an outer surface and an opposite mounting surface for mounting the base member on the foundation;

a support member having an outer surface and an opposite mounting surface for mounting the support member on the instrument, the support member having a unitary heat sink for dissipating heat from the instrument;

an intermediate member extending between the base member and the support member;

first pivotal means for pivotal attachment of the intermediate member to the base member; and second pivotal means for pivotal attachment of the intermediate member to the support member.

2. The bracket of claim 1, wherein:

the intermediate member includes an elongated element extending between opposite first and second ends, the intermediate member having a first arm extending generally perpendicularly from the elongated element first end, the first arm and the elongated element lying within a first plane, the intermediate member having a second arm extending generally perpendicularly from the elongated element second end, the second arm and the elongated element lying within a second plane generally perpendicular to the first plane;

the base member includes a base pivot hole;

the first pivotal means includes pivotal engagement of the first arm in the base pivot hole;

the bracket further comprises first clamping means for releasably clamping the first arm in the base pivot hole so as to allow adjustment of a base angle of the elongated element with respect to the base member and selective locking of the base angle;

the support member includes a support pivot hole;

the second pivotal means includes pivotal engagement of the second arm in the support pivot hole;

the bracket further comprises second clamping means for releasably clamping the second arm in the support pivot hole so as to allow adjustment of a support angle of the support member with respect to the elongated element and selective locking of the support angle; and the heat sink includes a plurality of fins arrayed on the outer surface of the support member.

3. The bracket of claim 2, wherein:

the base member includes a base slot generally parallel to the base pivot hole, the base slot communicating with the base pivot hole and extending to the base member outer surface;

the first clamping means includes at least one clamping screw disposed transversely to the base slot and threadingly engaging the base member, so that as the clamping screw is advanced, opposite sides of the base slot will be drawn together, thereby clamping the first arm in the base pivot hole;

the support member includes a support slot generally parallel to the support pivot hole, the support slot communicating with the support pivot hole and extending to the support member outer surface; and the second clamping means includes at least one clamping screw disposed transversely to the support slot and threadingly engaging the support member, so that as the clamping screw is advanced, opposite sides of the support slot will be drawn together, thereby clamping the second arm in the support pivot hole.

4. A bracket for mounting an instrument upon a foundation, the bracket comprising:

a base member having an outer surface and an opposite mounting surface for mounting the base member on the foundation, the base member including a base pivot hole;

a support member having an outer surface and an opposite mounting surface for mounting the support member on the instrument, the support member including a support pivot hole, the support member including a plurality of fins arrayed on the outer surface forming a heat sink unitary with the support member for dissipating heat from the instrument;

an intermediate member extending between the base member and the support member, the intermediate member including an elongated element extending between opposite first and second ends, the intermediate member having a first arm extending generally perpendicularly from the elongated element first end, the first arm and the elongated element lying within a first plane, the first arm pivotally engaging the base pivot hole, the intermediate member having a second arm extending generally perpendicularly from the elongated element second end, the second arm and the elongated element lying within a second plane generally perpendicular to the first plane, the second arm pivotally engaging the support pivot hole;

first clamping means for releasably clamping the first arm in the base pivot hole so as to allow adjustment of a base angle of the elongated element with respect to the base member and selective locking of the base angle; and second clamping means for releasably clamping the second arm in the support pivot hole so as to allow adjustment of a support angle of the support member with respect to the elongated element and selective locking of the support angle.

5. The bracket of claim 4, wherein:

the base member includes a base slot generally parallel to the base pivot hole, the base slot communicating with the base pivot hole and extending to the base member outer surface;

the first clamping means includes at least one clamping screw disposed transversely to the base slot and threadingly engaging the base member, so that as the clamping screw is advanced, opposite sides of the base slot will be drawn together, thereby clamping the first arm in the base pivot hole;

the support member includes a support slot generally parallel to the support pivot hole, the support slot communicating with the support pivot hole and extending to the support member outer surface; and the second clamping means includes at least one clamping screw disposed transversely to the support slot and threadingly engaging the support member, so that as the clamping screw is advanced, opposite sides of the support slot will be drawn together, thereby clamping the second arm in the support pivot hole.

6. A method of mounting an instrument, having a heat source, upon a foundation, the method comprising the steps of:

mounting a base member on the foundation;

mounting a support member on the instrument;

extending an elongated element between the base member and the support member;

extending a first arm generally perpendicularly from a first end of the elongated element;

establishing a first plane including the first arm and the elongated element;

pivoting the first arm in a base member pivot hole;

extending a second arm generally perpendicularly from a second end of the elongated element;

establishing a second plane including the second arm and the elongated element, the second plane being generally perpendicular to the first plane;

pivoting the second arm in a support member pivot hole;

adjusting a base angle of the elongated element with respect to the base member;

clamping the first arm releasably in the base pivot hole, thereby selectively locking the base angle;

adjusting a support angle of the support member with respect to the elongated element;

clamping the second arm releasably in the support pivot hole, thereby selectively locking the support angle;

forming a heat sink unitary with the support member by arraying a plurality of fins on an outer surface of the support member; and dissipating heat from the instrument with the heat sink.

7. The method of claim 6, further comprising the steps of:

extending a base slot from the base pivot hole to an outer surface of the base member;

engaging the base member threadingly with a clamping screw disposed transversely to the base slot;

drawing opposite sides of the base slot together by advancing the clamping screw, thereby clamping the first arm in the base pivot hole;

extending a support slot from the support pivot hole to the outer surface of the support member;

engaging the support member threadingly with a clamping screw disposed transversely to the support slot; and drawing opposite sides of the support slot together by advancing the clamping screw, thereby clamping the second arm in the support pivot hole.

8. The method of claim 6, further comprising the step of:

locating the support member proximal to the heat source.

9. A bracket for mounting an instrument upon a foundation, the bracket comprising:

a base member having an outer surface and an opposite mounting surface for mounting the base member on the foundation;

a support member having an outer surface and an opposite mounting surface for mounting the support member on the instrument, the support member having a unitary heat sink for dissipating heat from the instrument; and, an intermediate member extending between the base member and the support member;

wherein the intermediate member is pivotally attached to the base member and the intermediate member is pivotally attached to the support member.

* * * * *